US009194907B1

(12) United States Patent
Seo et al.

(10) Patent No.: US 9,194,907 B1
(45) Date of Patent: Nov. 24, 2015

(54) SEMICONDUCTOR APPARATUS (71) Applicant: SK hynix Inc., Icheon-si Gyeonggi-do (KR)

(72) Inventors: Young Suk Seo, Icheon-si (KR); Ho Uk Song, Icheon-si (KR); Jun Hyun Chun, Icheon-si (KR); Tae Jin Kang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/816,591

(22) Filed: Aug. 3, 2015

Related U.S. Application Data (62) Division of application No. 13/845,308, filed on Mar. 18, 2013, now Pat. No. 9,128,145.

(30) Foreign Application Priority Data

Dec. 24, 2012 (KR) .......................... 10-2012-0152161

(51) Int. Cl.
| | |
|---|---|
| *G11C 7/00* | (2006.01) |
| *G01R 31/26* | (2014.01) |
| *H03L 1/00* | (2006.01) |
| *H03L 7/06* | (2006.01) |

(52) U.S. Cl.
CPC ........ *G01R 31/2644* (2013.01); *G01R 31/2607* (2013.01); *H03L 1/00* (2013.01); *H03L 7/06* (2013.01)

(58) Field of Classification Search
CPC .. G01R 31/2633; G01R 31/2607; H01L 1/00; H01L 7/06
USPC ................................................. 365/201, 194
See application file for complete search history.

(56) References Cited

U.S. PATENT DOCUMENTS

| | | | | |
|---|---|---|---|---|
| 6,385,129 B1* | 5/2002 | Silvestri | ................ | H03L 7/0814 327/156 |
| 6,944,039 B1* | 9/2005 | Nataraj | .................. | G11C 15/04 365/233.1 |
| 7,309,999 B2* | 12/2007 | Ong | ................. | G01R 31/31701 324/750.3 |
| 7,403,058 B2* | 7/2008 | Yeh | ........................ | F16B 39/24 327/291 |
| 7,619,433 B2* | 11/2009 | Kang | ............... | G01R 31/31715 324/756.02 |
| 8,369,159 B2* | 2/2013 | Kim | ..................... | G11C 29/022 365/189.02 |
| 8,595,575 B2* | 11/2013 | Do | ..................... | G11C 29/1201 714/731 |
| 2006/0097763 A1* | 5/2006 | Schmitt | ................. | H03L 7/0812 327/158 |
| 2011/0157968 A1* | 6/2011 | Em | ........................ | G11C 29/02 365/163 |

\* cited by examiner

*Primary Examiner* — Viet Q Nguyen
(74) *Attorney, Agent, or Firm* — William Park & Associates Ltd.

(57) ABSTRACT

A semiconductor apparatus includes: an output timing controller configured to delay an applied external read command by a predetermined time and generate a normal output enable flag signal, during a normal mode, a test output timing controller configured to generate a DLL clock signal from an external clock signal, delay the applied external read command in synchronization with the DLL clock signal, and output the delayed applied external read command as a test output enable flag signal, during a test mode, and a multiplexer (MUX) configured to output any one of the normal output enable flag signal or the test output enable flag signal as an output enable flag signal.

9 Claims, 8 Drawing Sheets

SEMICONDUCTOR APPARATUS

CROSS-REFERENCES TO RELATED APPLICATION

The present application claims priority under 35 U.S.C. §119(a) to Korean application number 10-2012-0152161 filed on Dec. 24, 2012 in the Korean Intellectual Property Office, which is incorporated herein by reference in its entirety.

BACKGROUND

1. Technical Field

Various embodiments relate generally to a semiconductor apparatus, and more particularly, to a test mode of a semiconductor apparatus.

2. Related Art

A semiconductor apparatus typically employs a clock synchronous system to adjust operation timing in order to satisfy a high-speed operation without error. However, a semiconductor apparatus operating as a clock asynchronous system such as mobile DRAM is still used when necessary. The clock asynchronous semiconductor apparatus processes a received signal and data according to a delay amount set therein. However, due to process, voltage, and temperature (PVT) effects or the like, data may not be outputted at a desired time. Since a controller is utilized during a normal operation to control the clock asynchronous semiconductor apparatus when processing data outputted from the semiconductor apparatus in consideration of the aforementioned effects, data may be outputted at a desired time.

Figure 1:
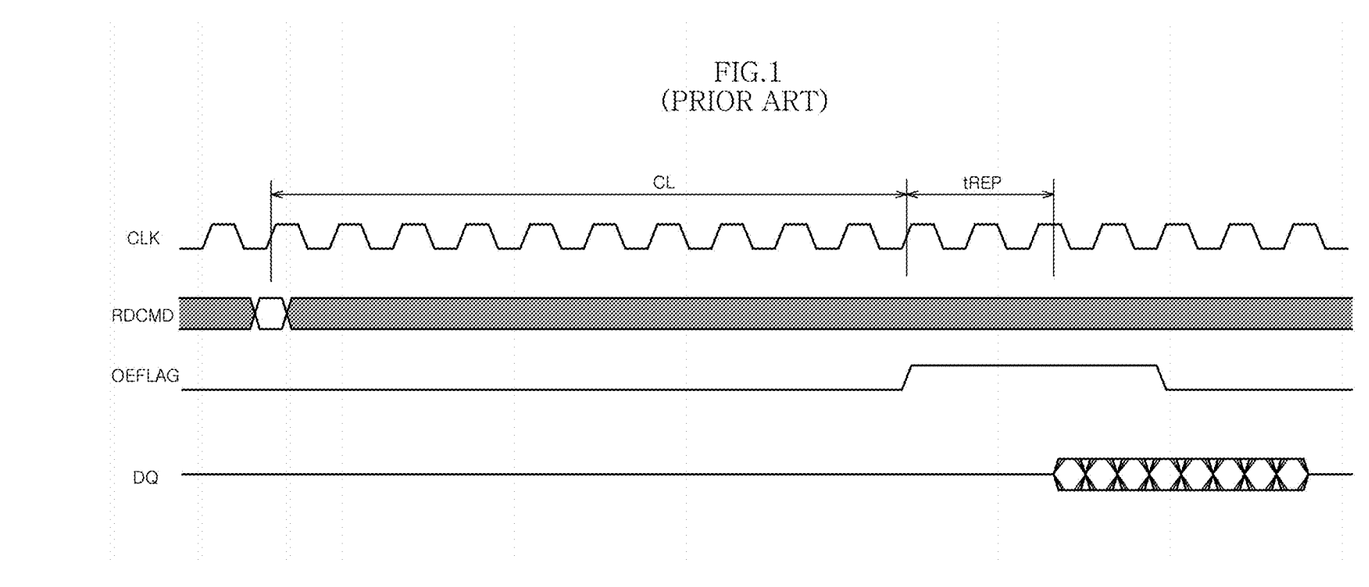
FIG. 1 is an operation waveform diagram of a conventional clock asynchronous semiconductor apparatus.

FIG. 1 is an operation waveform diagram of a conventional clock asynchronous semiconductor apparatus.

The semiconductor apparatus outputs data at a time according to a preset CAS latency (CL) during a read operation. The CL indicates the number of clock cycles between when an external read command RDCMD is inputted and when a first data is outputted, based on an external clock signal CLK.

The clock asynchronous semiconductor apparatus receives the external read command RDCMD from an external controller in synchronization with the external clock signal CLK. Then, the clock asynchronous semiconductor apparatus delays the external read command RDCMD by the CL based on the delay amount set therein, and outputs the delayed signal as an output enable flag signal OEFLAG. The delayed signal is not outputted immediately when the output enable flag signal OEFLAG is activated, but is rather outputted after a delay amount tREP based on an internal data output path of the semiconductor apparatus.

The delayed signal is further delayed by the delay amount based on the internal data output path after the CL. Furthermore, since the delay amount is influenced by PVT variation, the data output time cannot be controlled precisely.

During the normal operation, however, the controller, as described above, may control the semiconductor apparatus processes data in consideration of the aforementioned effects, thereby outputting data when desired. However, when a test device does not have the same function as the controller while the semiconductor apparatus is being tested, the test device cannot accurately recognize and analyze data outputted from the clock asynchronous semiconductor apparatus.

SUMMARY

In an embodiment, a semiconductor apparatus includes: an to output timing controller configured to delay an applied external read command by a predetermined time and generate a normal output enable flag signal, during a normal mode; a test output timing controller configured to generate a DLL clock signal from an external clock signal, delay the applied external read command in synchronization with the DLL clock signal, and output the delayed applied external read command as a test output enable flag signal, during a test mode; and a multiplexer (MUX) configured to output any one of the normal output enable flag signal or the test output enable flag signal as an output enable flag signal.

In another embodiment, a semiconductor apparatus includes: an output timing controller configured to delay an applied external read command by a predetermined time and generate a normal output enable flag signal, during a normal mode; a test output timing controller configured to determine a delay amount by inputting a reference clock signal obtained by dividing an external clock signal by a value N into a DLL, delay the applied external read command by the delay amount when the DLL is locked, shift the delayed applied external read command by a CL code in synchronization with a DLL clock signal, and output the shifted delayed applied external read command as a test output enable flag signal, during a test mode; and a MUX configured to output any one of the normal output enable flag signal or the test output enable flag signal as an output enable flag signal.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the to present invention will be described below with reference to the accompanying drawings through various embodiments.

Figure 2:
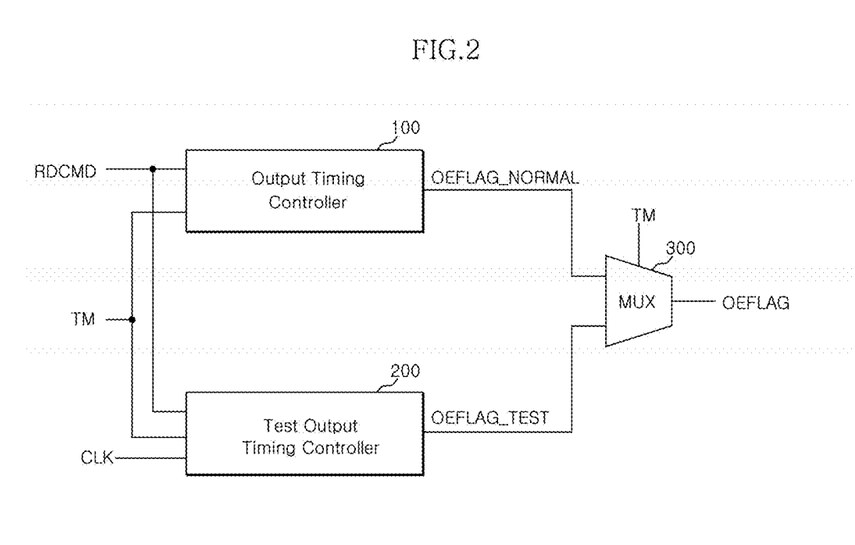
FIG. 2 is a block diagram of a semiconductor apparatus according to an embodiment of the present invention.

The semiconductor apparatus of FIG. 2 may include an output timing controller 100, a test output timing controller 200, and a multiplexer (MUX) 300.

The output timing controller 100 may be configured to delay an applied external read command RDCMD by a predetermined delay amount and output the delayed read command RDCMD as a normal output enable flag signal OEFLAG_NORMAL, during a normal mode. That is, when the asynchronous semiconductor apparatus according to an embodiment performs a normal operation, the semiconductor apparatus may delay the external read command RDCMD by a delay amount set therein and output the delayed read command RDCMD as the normal output enable flag signal OEFLAG_NORMAL. The predetermined delay amount may be set according to CL, for example. The output timing controller 100 may be enabled when a deactivated test mode signal TM is applied.

The test output timing controller 200 may be configured to generate a DLL clock signal (not illustrated) from the external clock signal CLK, delay the applied external read command RDCMD in synchronization with the DLL clock signal, and output the delayed read command RDCMD as a test output enable flag signal OEFLAG_TEST, during a test mode. That is, the asynchronous semiconductor apparatus according to an embodiment may operate in synchronization with the DLL clock signal during the test mode. While the output timing controller 100 may delay the external read command RDCMD by the delay amount set therein, the test output timing controller 200 may delay the external read command RDCMD in synchronization with. the generated DLL clock signal. The test output timing controller 200 may be enabled when the activated test mode signal TM is applied.

The MUX 300 may be configured to output any one of the normal output enable flag signal OEFLAG_NORMAL or the test output enable flag signal OEFLAG_TEST as an output enable flag signal OEFLAG, depending on whether the current mode is normal mode or test mode. Specifically, when the deactivated test mode signal TM is applied, the MUX 300 may output the normal output enable flag signal OEFLAG_NORMAL as the output enable flag signal OEFLAG, and when the activated test mode signal TM is applied, the MUX 300 may output the test output enable flag signal OEFLAG_TEST as the output enable flag signal OEFLAG.

Figure 3:
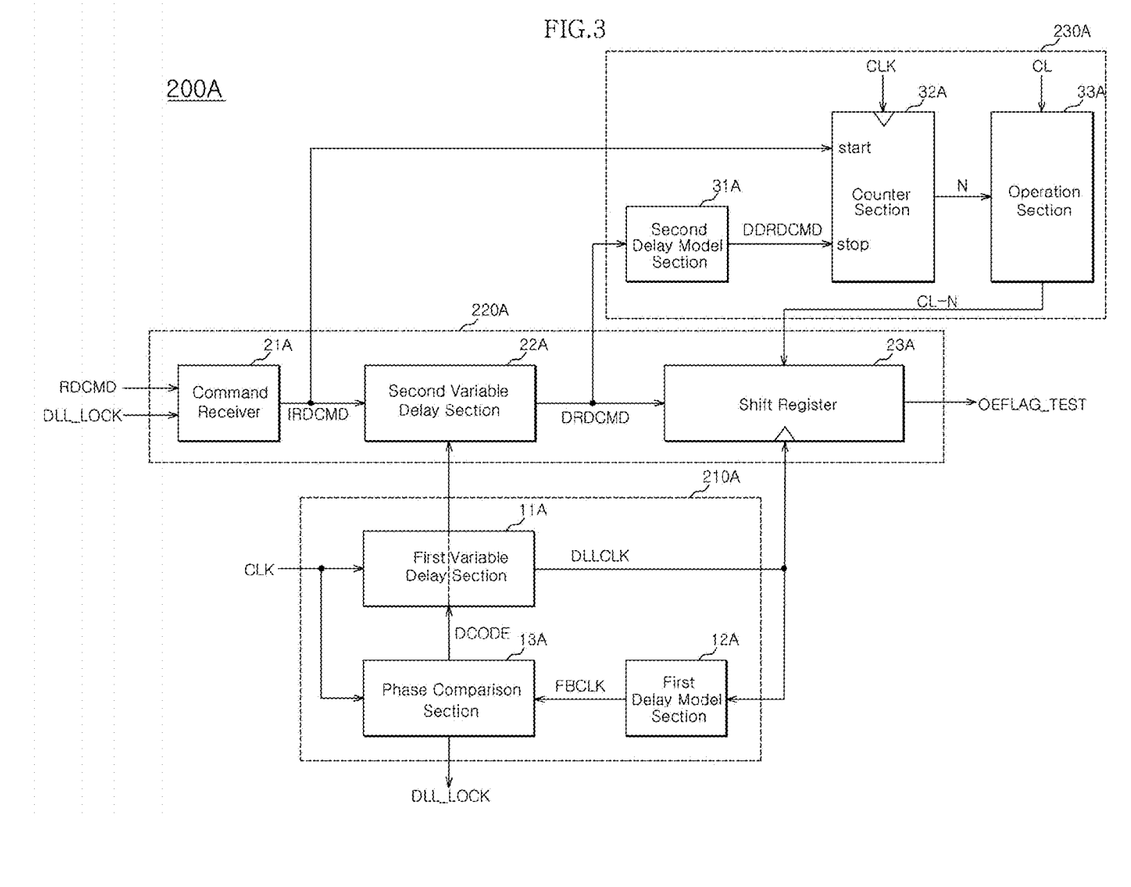
FIG. 3 is a block diagram illustrating an embodiment of the test output timing controller of FIG. 2.

Referring to FIG. 3, the test output timing controller 200A may include a delay locked loop (DLL) 210A, a phase control unit 220A, and a delay control code generation unit 230A.

The DLL 210A may be configured to delay the external clock signal CLK and generate a DLL clock signal DLLCLK. When the DLL 210A is locked, the DLL 210A may output an activated DLL locking signal DLL_LOCK.

The phase control unit 220A may be configured to receive the external read command RDCMD and generate the test output enable flag signal OEFLAG_TEST. The phase control unit 220A may receive and delay the external read command RDCMD when the DLL locking signal DLL_LOCK is activated, shift the delayed read command RDCMD by a delay control code CL-N in synchronization with the DLL clock signal DLLCLK, and output the shifted signal as the test output enable flag signal OEFLAG_TEST.

The delay control code generation unit 230A may be configured to count a counting code N, subtract the counting code N from a CL code, and generate the delay control code CL-N.

The DLL 210A may further include a first variably delay section 11A, a first delay model section 12A, and a phase comparison section 13A.

The first variable delay section 11A may be configured to delay the external clock signal CLK in response to a delay amount control signal DCODE and generate the DLL clock signal DLLCLK.

The first delay model section 12A may be configured to delay the DLL clock signal DLLCLK by a model delay value tREP obtained by modeling time delay based on the data output path and output the delayed DLL clock signal DLLCLK as a feedback clock signal FDCLK.

The phase comparison section 13A may be configured to compare the phases of the external clock signal CLK and the feedback clock signal FBCLK and generate the delay amount control signal DCODE according to the comparison result.

The delay amount control signal DCODE may be used to control the delay amount of the first variable delay section 11A until the external clock signal CLK and the feedback clock signal FBCLK have the same phase. When the external clock signal CLK and the feedback clock signal FBCLK have the same phase, the first variable delay section 11A may generate the DLL clock signal DLLCLK to accurately compensate for the model delay value tREP. The delay amount of the first variable delay section 11A may become N*tCK−tREP. When the external clock signal CLK and the feedback clock signal FBCLK have the same phase, the DLL 210A may be locked, and the phase comparison section 13A may activate the DLL lock signal DLL_LOCK.

The phase control unit 220A may include a command receiver 21A, a second variable delay section 22A, and a shift register 23A.

The command receiver 21A may be configured to receive the external read command RDCMD when the DLL locking signal DLL_LOCK is activated, and output the received external read command RDCMD as a read command IRDCMD.

The second variable delay section 22A may be configured to delay the read command IRDCMD in response to the delay amount control signal DCODE and output the delayed read command DRDCMD.

The shift register 23A may be configured to shift the delayed read command DRDCMD by the delay control code CL-N in synchronization with the DLL clock signal DLLCLK, and output the shifted delayed read command DRDCMD as the test output enable flag signal OEFLAG_TEST.

The delay control code generation unit 230A may include a second delay model section 31A, a counter section 32A, and an operation section 33A.

The second delay model section 31A may be configured to delay the delayed read command DRDCMD by the model delay value tREP and output the delayed read command DRDCMD as a model delayed read command DDRDCMD.

The counter section 32A may be configured to perform a counting operation in synchronization with a counting clock signal, for example, the external clock signal CLK. The counter section 32A starts counting when the read command IRDCMD is applied and stops counting when the model delayed read command DDRDCMD is applied. The counter section 32A may output the counted value as the counting code N. Therefore, the counter section 32A may count the counting code N after the DLL 210A is locked.

The operation section 33A may be configured to subtract the counting code N from the CL code and output the delay control code CL-N.

Figure 4:
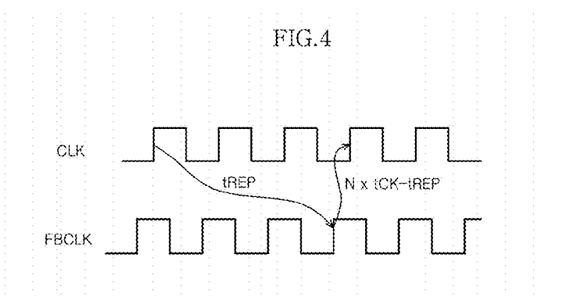
FIG. 4 is a waveform diagram illustrating the operation of a DLL of FIG. 3.

Referring to FIG. 4, when the DLL 210A is reset and then starts to operate, the feedback clock signal FBCLK may have a phase delayed by the model delay value tREP from the external clock signal CLK. This is because the delay amount of the first variable delay section 11A is not yet controlled. Since the delay amount is controlled once the feedback clock signal FBCLK and the external clock signal CLK have the same phase, the delay amount control signal DCODE may be set to control the delay amount of the first variable delay section 11A by N*tCK−tREP. The DLL 210A is subsequently locked.

Figure 5:
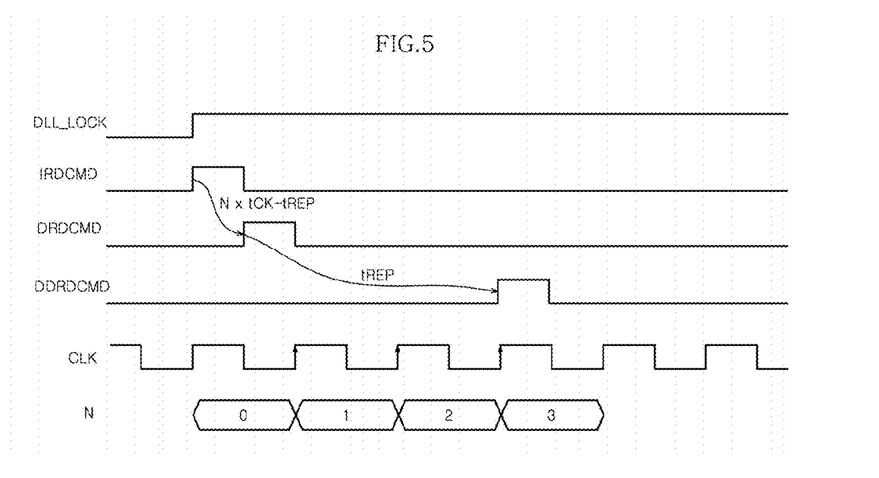
FIG. 5 is a waveform diagram illustrating the operation of the delay control code generation unit of FIG. 3.

Referring to FIG. 5, only when the DLL locking signal DLL_LOCK is activated may the command receiver 21A receive the external read command RDCMD and generate the read command IRDCMD. Ideally, the external read command RDCMD and the read command IRDCMD are in phase.

The phase of the read command IRDCMD may be controlled by N*tCK−tREP through the second variable delay section 22A of the phase control unit 220A, and then outputted as the delayed read command DRDCMD. This may occur because the second variable delay section 22A may control substantially the same delay amount as the first variable delay section 11A according to the fixed delay amount control signal DCODE. The delayed read command DRDCMD may be delayed by the model delay value tREP through the second delay model section 31A and outputted as the model delayed read command DDRDCMD.

The counter section 32A may count the external clock signal CLK from when the read command IRDCMD is applied to when the model delayed read command DDRDCMD is applied, and generate the counting code N. In FIG. 5, the counting code N corresponds to 3.

The operation section 33A may subtract the counting code N from the CL code and output the delay control code CL-N.

That is, according to an embodiment, the counting code N may be counted to accurately set the data output timing in consideration of the data output path.

Figure 6:
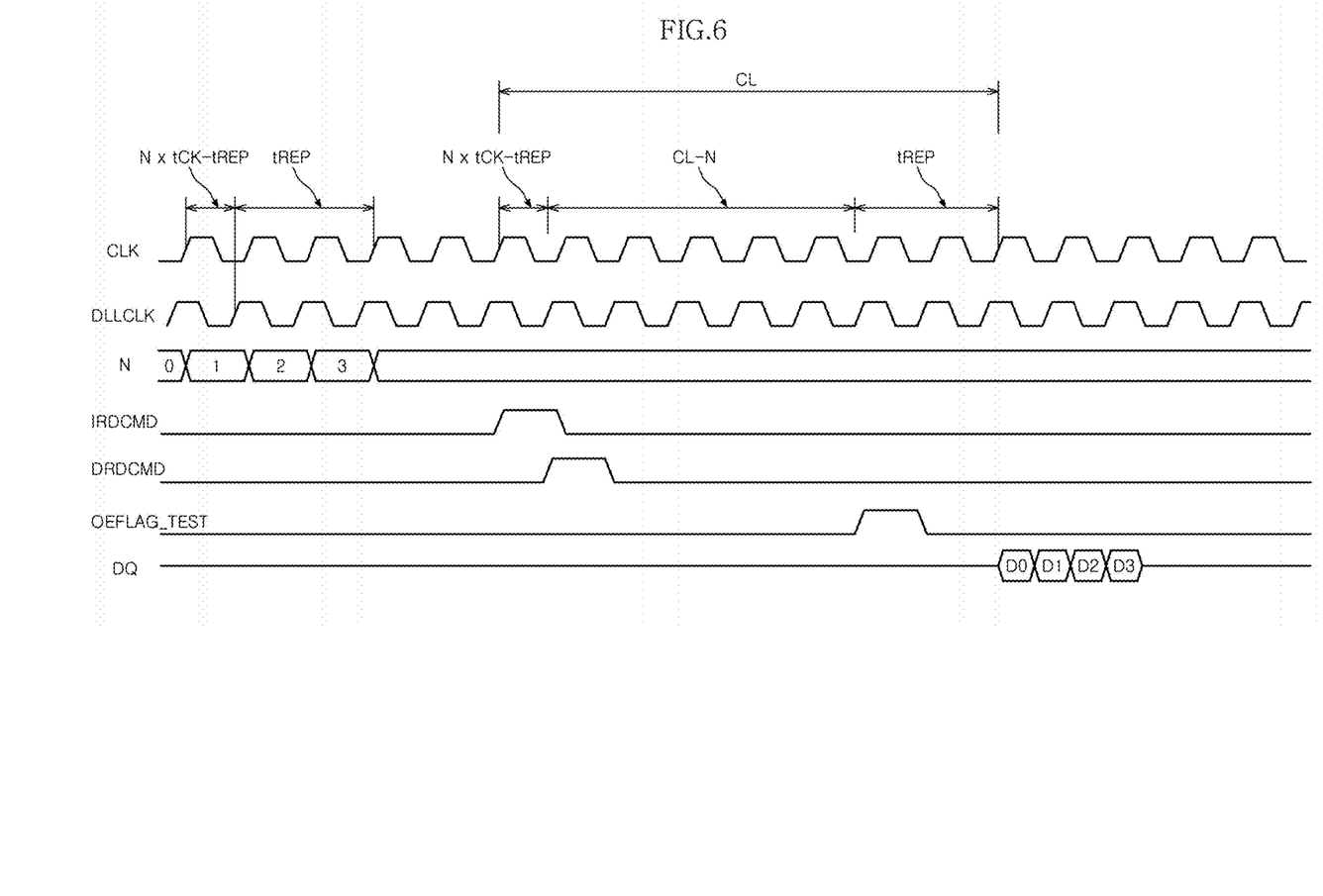
FIG. 6 is a waveform diagram illustrating an operation of the test output timing controller of FIG. 3.

Referring to FIG. 6, during the test mode, when the read command IRDCMD is applied in synchronization with the external clock signal CLK, data D0 to D3 (not illustrate in FIG. 3) may be outputted after the CL according to the specifications as mentioned above. The test output enable flag signal OEFLAG_TEST may serve to enable outputting of the data D0 to D3 during the test mode. The data D0 to D3 may particularly be outputted when the delay amount tREP of the data output path elapses after the test output enable flag signal OEFLAG_TEST is activated. The test output enable flag signal OEFLAG_TEST may be generated in synchronization with the DLL clock signal DLLCLK inside the semiconductor apparatus.

When the test output enable flag signal OEFLAG_TEST is generated, the delay amount tREP of the data output path must be considered. The semiconductor apparatus counts the counting code N. The clock delay amount (N*tCK−tREP) when the DLL 210A is locked and the delay amount tREP of the data output path may be counted based on the external clock signal CLK, in order to generate the counting code N. First, the semiconductor apparatus may delay the read command IRDCMD by N*tCK−tREP and output the delayed read command DRDCMD. Then, the semiconductor apparatus may shift the delayed read command DRDCMD by the delay control code CL-N in synchronization with the DLL clock signal DLLCLK. The test output enable flag signal OEFLAG_TEST may then be outputted.

Therefore, during the test mode, the data D0 to D3 may be outputted when the CL elapses after the read command IRDCMD is received.

In an embodiment according to FIG. 6, the counting code N may be counted to control the data output timing during each operation. In an embodiment according to FIG. 7, however, the counting code N may be preset to control the data output timing.

Figure 7:
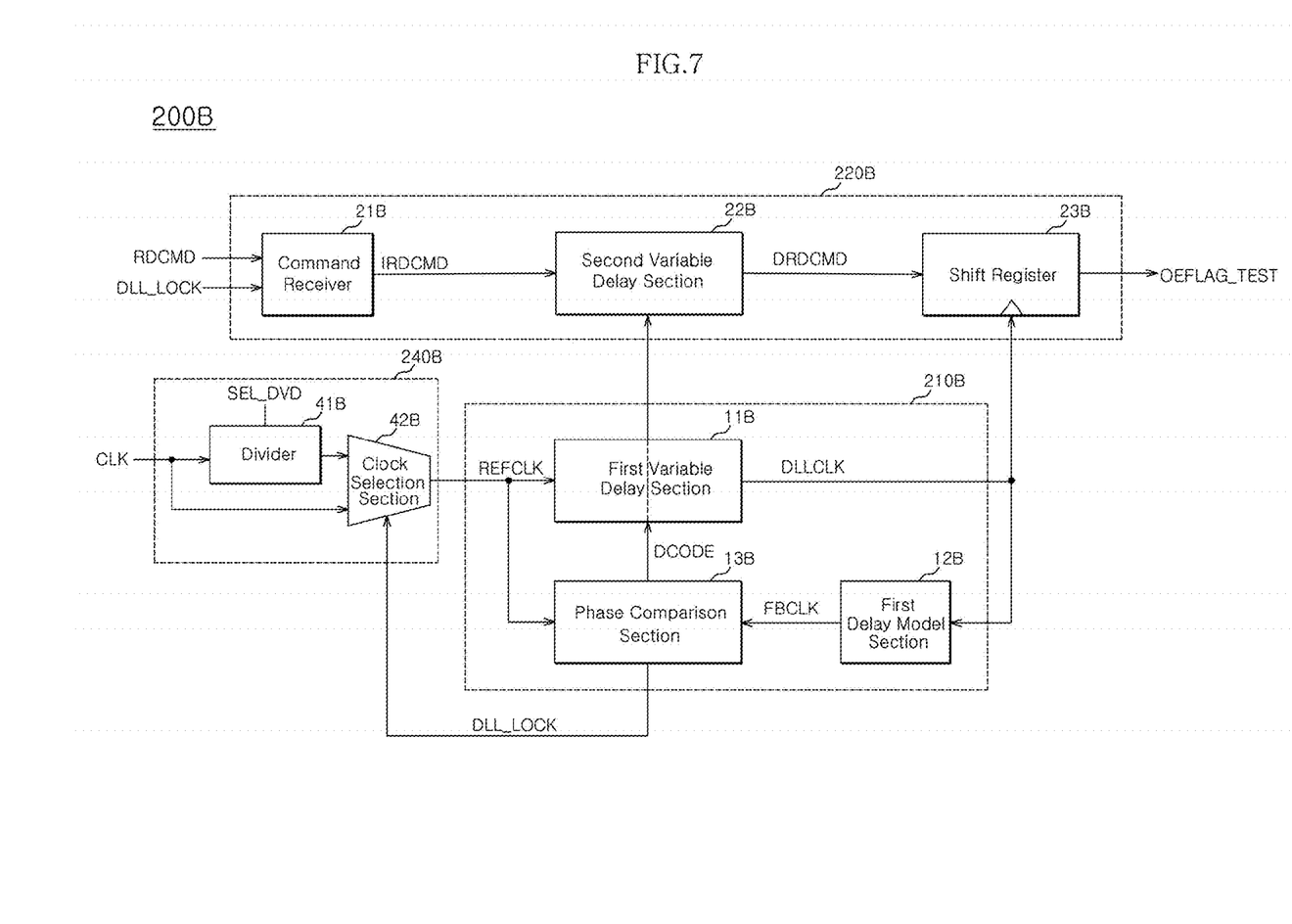
FIG. 7 is a block diagram illustrating another embodiment of the test output timing controller of FIG. 2.

Referring to FIG. 7, the test output timing controller 200B may include a DLL 210B, a phase control unit 220B, and a clock division unit 240B.

The DLL 210B may be configured to delay a reference clock signal REFCLK and generate a DLL clock signal DLLCLK. When the DLL 210B is locked, the DLL 210B may output an activated DLL locking signal DLL_LOCK.

The phase control unit 220B may be configured to receive the external read command RDCMD and generate a test output enable flag signal OEFLAG_TEST. In particular, the phase control unit 220B may receive and delay the external read command RDCMD when the DLL lock signal DLL_LOCK is activated, further shift the delayed external read command RDCMD by the CL code in synchronization with the DLL clock signal DLLCLK, and output the shifted external read command RDCMD as the test output enable flag signal OEFLAG_TEST.

Specifically, the DLL 210B may include a first variable delay section 11B, a first delay model section 12B, and a phase comparison section 13B.

The first variable delay section 11B may be configured to delay the reference clock signal REFCLK in response to the delay amount control signal DCODE and generate the DLL clock signal DLLCLK.

The first delay model section 12B may be configured to delay the DLL clock signal DLLCLK by the model delay value tREP obtained by modeling time delay based on the data output path, and output the delayed DLL clock signal DLLCLK as a feedback clock signal FBCLK.

The phase comparison section 13B may be configured to compare the phases of the reference clock signal CLK and the feedback clock signal FBCLK and generate the delay amount control signal DCODE according to the comparison result.

The delay amount control signal DCODE may be used to control the delay amount of the first variable delay section 11B until the reference clock signal REFCLK and the feedback clock signal FBCLK have the same phase. When the external clock signal CLK and the feedback clock signal FBCLK have the same phase, the first variable delay section 11B may generate the DLL clock signal DLLCLK to accurately compensate for the model delay value tREP. The delay amount of the first variable delay section 11B may become N*tCK−tREP. When the reference clock signal REFCLK and the feedback clock signal FBCLK have the same phase, the DLL 210B may be locked, and the phase comparison section 13B may activate the DLL locking signal DLL_LOCK.

The phase control unit 220B may include a command receiver 21B, a second variable delay section 22B, and a shift register 23B.

The command receiver 21B may be configured to receive the external read command RDCMD when the DLL locking signal DLL_LOCK is activated, and output the received external read command RDCMD as the read command IRDCMD.

The second variable delay section 22B may be configured to delay the read command IRDCMD in response to the delay amount control signal DCODE and output the delayed read command DRDCMD.

The shift register 23B may be configured to shift the delayed read command DRDCMD by the CL code in synchronization with the DLL clock signal DLLCLK, and output the shifted delayed read command DRDCMD as the test output enable flag signal OEFLAG_TEST.

The clock division unit 240B may be configured to divide the external clock signal CLK and output the divided external clock signal CLK as the reference clock signal REFCLK, or output the external clock signal CLK as the reference clock signal REFCLK, depending on whether the DLL 210B is locked or not.

The clock division unit 240B may include a divider 41B and a clock selection section 42B.

The divider 41B may be configured to receive the external clock signal CLK and divide the external clock signal CLK in response to a divide select signal SEL_DVD.

The clock selection section 42B may be configured to output is any one of an output of the divider 41B or the external clock signal CLK as the reference clock signal REFCLK in response to the DLL locking signal DLL_LOCK.

When the DLL locking signal DLL_LOCK is deactivated, the clock selection section 42B may output the output of the divider 41B as the reference clock signal REFCLK, and when the DLL locking signal DLL_LOCK is activated, the clock selection section 42B may output the external clock signal CLK as the reference clock signal REFCLK.

When the DLL 210B is reset and starts to operate, that is, when the DLL locking signal DLL_LOCK is deactivated, the clock division unit 240B may divide the external clock signal CLK in response to the preset divide select signal SEL_DVD, and output the divided external clock signal CLK as the reference clock signal REFCLK. Before the DLL 210B is locked, the DLL 210B may operate by receiving the reference clock signal REFCLK generated by dividing the external clock signal CLK. Therefore, the delay amount (N*tCK−tREP) of the first variable delay section 11B may be determined by the reference clock signal REFCLK generated by dividing the external clock signal CLK. Therefore, N may be differently determined by the divide select signal SEL_DVD set by the clock division unit 240B. Then, although the DLL 210B may be locked and the external clock signal CLK may be outputted as the reference clock signal REFCLK, the delay amount (N*tCK−tREP) of the first variable delay section 11B may be maintained. Accordingly, N may also be maintained.

Figure 8A:
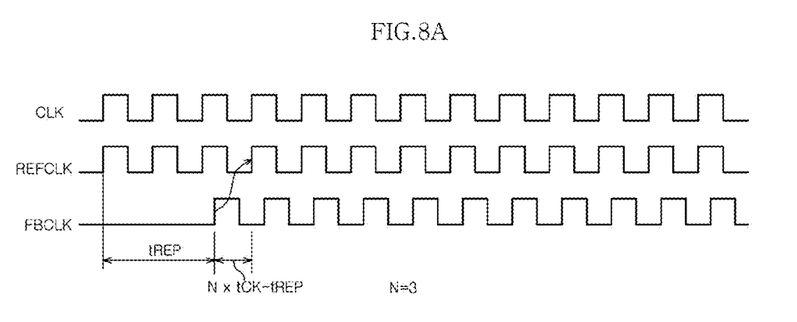
FIGS. 8A to 8C are waveform diagrams illustrating operations of the DLL depending on various settings of a clock division unit of FIG. 7.

FIG. 8A is a waveform diagram illustrating an operation of the DLL 210B when the clock division unit 240B outputs the external clock signal CLK as the reference clock signal REFCLK.

When the DLL 210B starts to operate, the feedback clock signal FBCLK may be generated when the model delay value tREP elapses after the reference clock signal REFCLK is applied. Since the first variable delay section 11B may control the delay amount such that the feedback clock signal FBCLK has the same phase as the reference clock signal REFCLK, the variable delay section 11B may have a delay amount of N*tCK−tREP. Therefore, in FIG. 8A, the counting code N may be 3 as an example.

Figure 8B:
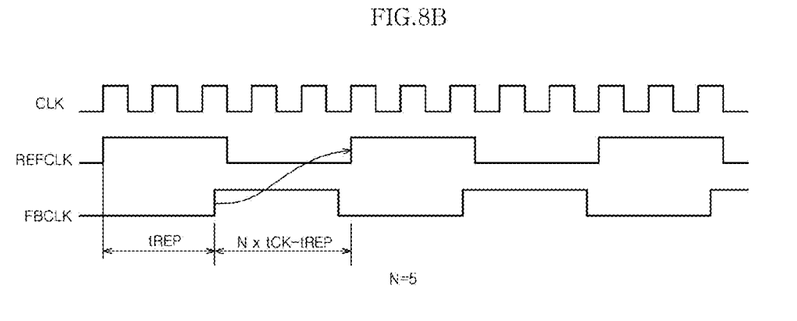

FIG. 8B is a waveform diagram illustrating an operation of the DLL 210B when the clock division unit 240B divides the external clock CLK when the counting code N is five, and outputs the divided signal as the reference clock signal REFCLK.

When the DLL 210B starts to operate, the feedback clock signal FBCLK may be generated when the model delay value tREP elapses after the reference clock signal REFCLK is applied. Since the variable delay section 11B may control the delay amount such that the feedback clock signal FBCLK has the same phase as the reference clock signal REFCLK, the first variable delay section 11B may have a delay amount of N*tCK−tREP. Therefore, in FIG. 8B, the counting code N may be 5 as an example. Then, when the DLL 210B is locked, the reference clock signal REFCLK having the same phase as the external clock signal CLK may be applied, but the delay amount of N*tCK−tREP (N=5) will not change.

Figure 8C:
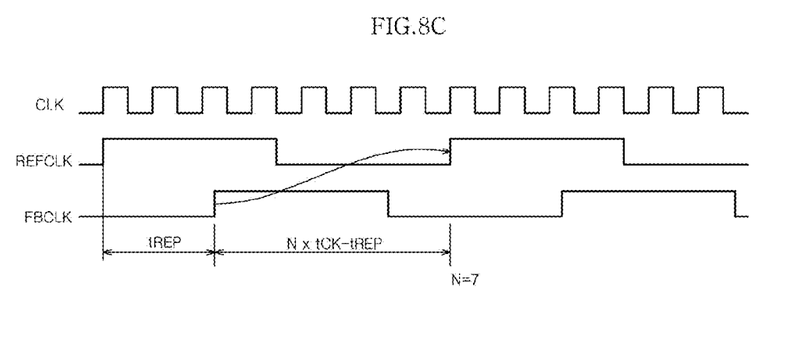

FIG. 8C is a waveform diagram illustrating an operation of the DLL 210B when the clock division unit 240B divides the external clock signal CLK when the counting code N is seven, and outputs the divided signal as the reference clock signal REFCLK.

When the DLL 210B starts to operate, the feedback clock signal FBCLK may be generated when the model delay value tREP elapses after the reference clock signal REFCLK is applied. Since the variable delay section 11B may control the delay amount such that the feedback clock signal FBCLK has the same phase as the reference clock signal REFCLK, the first variable delay section 11B may have a delay amount of N*tCK−tREP. Therefore, in FIG. 8C, the counting code N may be 7 as an example. Then, when the DLL 210B is locked, the reference clock signal REFCLK having the same phase as the external clock signal CLK may be applied, but the delay amount of N*tCK−tREP (N=7) will not change.

As described with reference to FIGS. 8B and 8C, when the clock division unit 240B divides the external clock signal CLK by a sufficiently large counting code N, the delay amount (N*tCK−tREP) of the variable delay section 11B may be determined by N.

Figure 9:
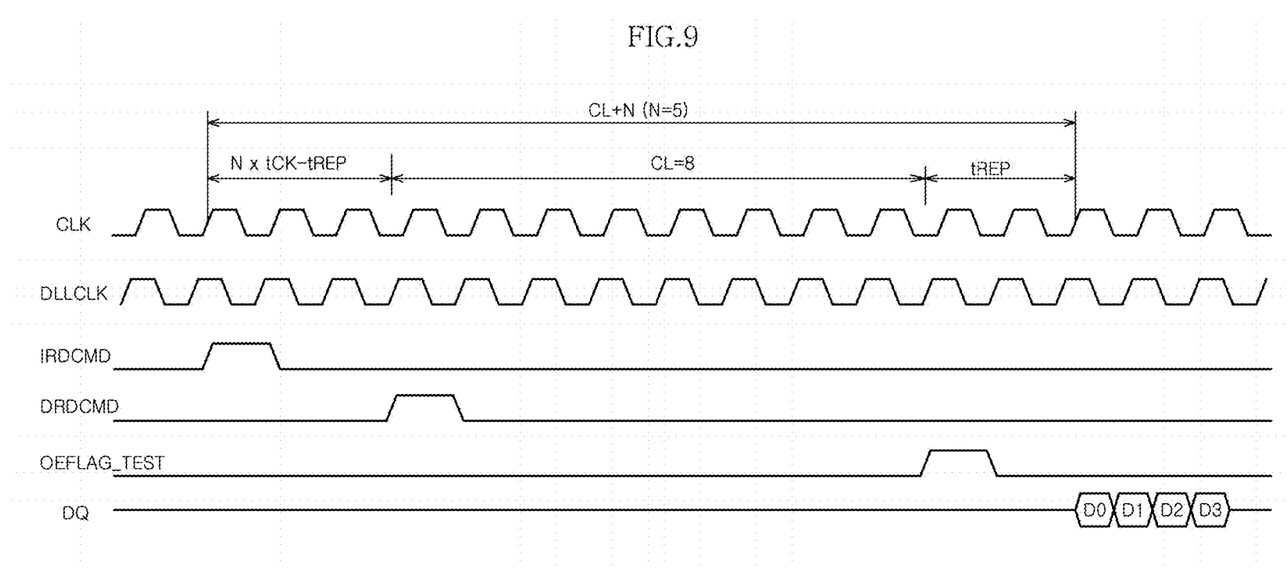
FIG. 9 is a waveform diagram illustrating an operation of the test output timing controller of FIG. 7.

According to an embodiment, the counting code N may be preset by the divide select signal SEL_DVD of the clock division unit 240B. FIG. 9 illustrates a case in which N is set to 5.

When the read command IRDCMD is applied in synchronization with the external clock signal CLK after the DLL 210B is locked, the second variable delay section 22B may delay the read command IRDCMD by N*tCK−tREP and output the delayed read command DRDCMD. Since the second variable delay section 22B may control the delay amount according to the fixed delay amount control signal DCODE like in the first variable delay section 11B, the second variable delay section 22B may have substantially the same or similar delay amount as the first variable delay section 11B.

The shift register 23B may shift the delayed read command DRDCMD by the CL code in synchronization with the fixed DLL clock signal DLLCLK, and output the shifted delayed read command DRDCMD as the test output enable flag signal OEFLAG_TEST. The data D0 to D3 may be outputted to the when the delay amount (tREP) of the data output path elapses after the test output enable flag signal OEFLAG_TEST is activated.

Therefore, in the test output timing controller 200B according to an embodiment, the data D0 to D3 may be outputted when the CL and the external clock corresponding to the counting code N pass after the read command IRDCMD is received. Since the CL and N are setting values, the data output time during the test mode may be accurately controlled. Furthermore, the output data may be received at a desired time.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
an output timing controller configured to delay an applied external read command by a predetermined time and generate a normal output enable flag signal, during a normal mode;
a test output timing controller configured to determine a delay amount by inputting a reference clock signal obtained by dividing an external clock signal by a value N into a DLL, delay the applied external read command by the delay amount when the DLL is locked, shift the delayed applied external read command by a CL code in synchronization with a DLL clock signal, and output the shifted delayed applied external read command as a test output enable flag signal, during a test mode; and
a MUX configured to output any one of the normal output enable flag signal or the test output enable flag signal as an output enable flag signal.

2. The semiconductor apparatus according to claim 1, wherein the MUX outputs the normal output enable flag signal as the output enable flag signal during the normal mode, and outputs the test output enable flag signal as the output enable flag signal during the test mode.

3. The semiconductor apparatus according to claim 2, wherein the output timing controller is enabled when a deactivated test mode signal is applied, and the test output timing controller is enabled when an activated test mode signal is applied.

4. The semiconductor apparatus according to claim 1, wherein the test output timing controller comprises:
   a DLL configured to delay the reference clock signal and generate the DLL clock signal;
   a clock division unit configured to divide the external clock signal by the value N and output the divided external clock signal as the reference clock signal or output the external clock signal as the reference clock signal, depending on whether the DLL is locked or not; and
   a phase control unit configured to delay the applied external read command by the delay amount when the DLL is locked, shift the delayed read command by the CL code in synchronization with the DLL clock signal, and output the shifted applied external read command as the test output enable flag signal.

5. The semiconductor apparatus according to claim 4, wherein the DLL comprises:
   a first variable delay section configured to delay the reference clock signal in response to a delay amount control signal and generate the DLL clock signal;
   a first delay model section configured to delay the DLL clock signal by a model delay value and output the delayed signal as a feedback clock signal; and
   a phase comparison section configured to compare the phases of the reference clock signal and the feedback clock signal and generate the delay amount control signal and a DLL locking signal according to the comparison result.

6. The semiconductor apparatus according to claim 5, wherein the phase comparison section activates the DLL locking signal when the reference clock signal and the feedback clock signal have substantially the same phase.

7. The semiconductor apparatus according to claim 6, is wherein the clock division unit comprises:
   a divider configured to divide the external clock signal by a preset value; and
   a clock selection section configured to output an output of the divider as the reference clock signal when the deactivated DLL locking signal is applied, and output the external clock signal as the reference clock signal when the activated DLL locking signal is applied.

8. The semiconductor apparatus according to claim 6, wherein the phase control unit comprises:
   a command receiver configured to receive the external read command and output the received external read command as a read command when the activated DLL locking signal is applied;
   a second variable delay section configured to delay the read command in response to the delay amount control signal and output the delayed read command; and
   a shift register configured to shift the delayed read command by the CL code in synchronization with the DLL clock signal and output the shifted delayed read command as the test output enable flag signal.

9. The semiconductor apparatus according to claim 8, wherein the delay amounts of the first and second variable delay sections are controlled to substantially the same amount, in response to the delay amount control signal.

* * * * *